US008063809B2

(12) United States Patent
Liu et al.

(10) Patent No.: US 8,063,809 B2
(45) Date of Patent: Nov. 22, 2011

(54) TRANSIENT SIGNAL ENCODING METHOD AND DEVICE, DECODING METHOD AND DEVICE, AND PROCESSING SYSTEM

(75) Inventors: Zexin Liu, Shenzhen (CN); Longyin Chen, Beijing (CN); Lei Miao, Beijing (CN); Chen Hu, Shenzhen (CN); Wei Xiao, Shenzhen (CN); Herve Marcel Taddei, Voorburg (NL); Qing Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/172,652

(22) Filed: Jun. 29, 2011

(65) Prior Publication Data

US 2011/0251846 A1 Oct. 13, 2011

Related U.S. Application Data

(63) Continuation of application No. PCT/CN2009/076194, filed on Dec. 29, 2009.

(30) Foreign Application Priority Data

Dec. 29, 2008 (CN) .......................... 2008 1 0247009

(51) Int. Cl.
*H03M 1/12* (2006.01)

(52) U.S. Cl. ......... 341/155; 341/87; 381/94.2; 704/205; 704/208; 704/214; 704/226; 704/253; 704/254; 704/500; 704/501; 704/E11.006; 704/E19.014; 704/E19.012; 704/E21.007

(58) Field of Classification Search .................... 341/76, 341/87, 155; 381/56, 66, 94.2; 704/205, 704/208, 214, 225, 226, 239, 253, 254, 500, 704/501, E11.006, E19.014, E19.012, E21.002, 704/E21.007
See application file for complete search history.

(56) References Cited

U.S. PATENT DOCUMENTS 5,199,082 A 3/1993 Venema
(Continued)

FOREIGN PATENT DOCUMENTS

CN 1363923 A 8/2002
(Continued)

OTHER PUBLICATIONS

Foreign communication from a counterpart application, PCT application PCT/CN2009/076194, English Translation International Search Report dated Apr. 1, 2010, 5 pages.

(Continued)

*Primary Examiner* — Khai M Nguyen
(74) *Attorney, Agent, or Firm* — Conley Rose, P.C.; Grant Rodolph

(57) ABSTRACT

A transient signal encoding method and device, decoding method and device, and processing system, where the transient signal encoding method includes: obtaining a reference sub-frame where a maximal time envelope having a maximal amplitude value is located from time envelopes of all sub-frames of an input transient signal; adjusting an amplitude value of the time envelope of each sub-frame before the reference sub-frame in such a way that a first difference is greater than a preset first threshold, in which the first difference is a difference between the amplitude value of the time envelope of each sub-frame before the reference sub-frame and the amplitude value of the maximal time envelope; and writing the adjusted time envelope into bitstream.

14 Claims, 10 Drawing Sheets

U.S. PATENT DOCUMENTS

| | | | | |
|---|---|---|---|---|
| 5,659,622 | A | 8/1997 | Ashley | |
| 5,825,320 | A * | 10/1998 | Miyamori et al. | 341/139 |
| 5,960,390 | A | 9/1999 | Ueno et al. | |
| 6,122,610 | A | 9/2000 | Isabelle | |
| 6,314,396 | B1 * | 11/2001 | Monkowski | 704/233 |
| 7,340,391 | B2 * | 3/2008 | Herre et al. | 704/200.1 |
| 7,363,216 | B2 | 4/2008 | Absar et al. | |
| 7,546,237 | B2 | 6/2009 | Nongpiur et al. | |
| 7,627,481 | B1 * | 12/2009 | Kuo et al. | 704/500 |
| 7,636,659 | B1 * | 12/2009 | Athineos et al. | 704/205 |
| 2003/0177007 | A1 | 9/2003 | Kanazawa et al. | |
| 2005/0170649 | A1 | 8/2005 | Hirano | |
| 2007/0016411 | A1 * | 1/2007 | Kim et al. | 704/226 |
| 2009/0070118 | A1 | 3/2009 | Den Brinker et al. | |
| 2010/0121648 | A1 | 5/2010 | Zhang et al. | |
| 2011/0106529 | A1 * | 5/2011 | Disch | 704/205 |

FOREIGN PATENT DOCUMENTS

| | | | |
|---|---|---|---|
| CN | 1160702 | C | 8/2004 |
| CN | 1926608 | A | 3/2007 |
| CN | 1318662 | C | 5/2007 |
| CN | 1988565 | A | 6/2007 |
| CN | 101167128 | A | 4/2008 |
| CN | 101308655 | A | 11/2008 |
| EP | 1116224 | A1 | 7/2001 |
| EP | 1385150 | A1 | 1/2004 |
| EP | 1697930 | A1 | 9/2006 |
| EP | 1801787 | A1 | 6/2007 |
| ES | 2298394 | T3 | 5/2008 |
| JP | 2003216188 | A | 7/2003 |
| WO | 2010078816 | A1 | 7/2010 |

OTHER PUBLICATIONS

Foreign communication from a counterpart application, PCT application PCT/CN2009/076194, English Translation Written Opinion dated Apr. 1, 2010, 5 pages.

Foreign communication from a counterpart application, Chinese application 200810247009.7, Chinese office action, 1 page.

"3rd Generation Partnership Project; Technical Specification Group Services and System Aspects; Mandatory Speech Codec Speech Processing Functions; Adaptive Multi-Rate (AMR) Speech Codec; Voice Activity Detector (VAD) Release 6," Global System for Mobile Communications; 3GPP TS 26.094 V6.1.0 (Jun. 2006).

* cited by examiner

TRANSIENT SIGNAL ENCODING METHOD AND DEVICE, DECODING METHOD AND DEVICE, AND PROCESSING SYSTEM

CROSS-REFERENCE TO RELATED APPLICATIONS

This application is a continuation of International Application No. PCT/CN2009/076194, filed on Dec. 29, 2009, which claims priority to Chinese Patent Application No. 200810247009.7, filed on Dec. 29, 2008, both of which are hereby incorporated by reference in their entireties.

FIELD OF THE INVENTION

The present invention relates to the field of communication technologies, and in particular, to a transient signal encoding method and device, decoding method and device, and processing system.

BACKGROUND OF THE INVENTION

Due to the limitation of the number of bit rates for encoding speech signals and the influence of human auditory characteristics, low-frequency band information in a speech signal is always encoded first in an audio encoding algorithm. Compared with narrow-band speech, wide-band speech has the characteristics of being fuller and more natural; therefore, the acoustic quality can be improved by increasing the bandwidth for transmitting speech signals. When the number of bit rates for encoding speech signals is small, a bandwidth extension technology can be adopted to extend the bandwidth range of the speech signals and improve the quality of the speech signals.

In recent years, the bandwidth extension technology has developed significantly, and has found commercial applications in several fields, including acoustic enhancement of bass loudspeakers and high frequency enhancement of coded voice and audio.

Among current bandwidth extension methods, the encoding technology of low-frequency band information adopts existing encoding and decoding algorithms; and during the process of encoding and decoding high-frequency band information, a small number of bits are generally adopted to encode the high-frequency band information, and the high-frequency band information is recovered at a decoding end by using the correlation between the high-frequency and low-frequency bands.

In the implementation of the present invention, the inventor finds that a transient signal has the following characteristics different from those of a non-transient signal: in the time domain, the signal energy of the transient signal has a large instant change; while in the frequency domain, the frequency spectrum of the transient signal is smooth. In the prior art, the time envelope of the transient signal is not modified, and due to the influence of the processing in the signal encoding process, such as process by frame by frame, time-frequency transform, and frequency envelope, the transient signal is likely to generate a pre-echo; therefore, the prior art has the disadvantage that the effect of the transient signal recovered at the decoding end is not satisfactory.

SUMMARY OF THE INVENTION

The present invention is directed to a transient signal encoding method and device, decoding method and device, and processing system, which are configured to improve the quality of recovery of transient signals.

An embodiment of the present invention provides a transient signal encoding method, where the method includes: obtaining a reference sub-frame where a maximal time envelope having a maximal amplitude value is located from time envelopes of all sub-frames of an input transient signal; adjusting an amplitude value of the time envelope of each sub-frame before the reference sub-frame in such a way that a first difference is greater than a preset first threshold, in which the first difference is a difference between the amplitude value of the time envelope of each sub-frame before the reference sub-frame and the amplitude value of the maximal time envelope; and writing the adjusted time envelope into bitstream.

An embodiment of the present invention further provides a transient signal decoding method, where the method includes: obtaining a reference sub-frame where a maximal time envelope having a maximal amplitude value is located from time envelopes of all sub-frames of a pre-obtained signal having a signal type of a transient signal; adjusting an amplitude value of the time envelope of each sub-frame before the reference sub-frame in such a way that a first difference is greater than a preset first threshold, in which the first difference is a difference between the amplitude value of the time envelope of each sub-frame before the reference sub-frame and the amplitude value of the maximal time envelope; and modifying a pre-obtained time-domain signal according to the adjusted time envelope, so as to obtain a recovered transient signal.

An embodiment of the present invention further provides a transient signal encoding device, where the device includes: a reference sub-frame obtaining module, configured to obtain a reference sub-frame where a maximal time envelope having a maximal amplitude value is located from time envelopes of all sub-frames of an input transient signal; a first amplitude value adjusting module, configured to adjust an amplitude value of the time envelope of each sub-frame before the reference sub-frame in such a way that a first difference is greater than a preset first threshold, in which the first difference is a difference between the amplitude value of the time envelope of each sub-frame before the reference sub-frame and the amplitude value of the maximal time envelope; and a bitstream writing module, configured to write the adjusted time envelope into bitstream.

An embodiment of the present invention further provides a transient signal decoding device, where the device includes: a reference sub-frame obtaining module, configured to obtain a reference sub-frame where a maximal time envelope having a maximal amplitude value is located from time envelopes of all sub-frames of a pre-obtained signal having a signal type of a transient signal; a first amplitude value adjusting module, configured to adjust an amplitude value of the time envelope of each sub-frame before the reference sub-frame in such a way that a first difference is greater than a preset first threshold, in which the first difference is a difference between the amplitude value of the time envelope of each sub-frame before the reference sub-frame and the amplitude value of the maximal time envelope; and a time-domain signal modification module, configured to modify a pre-obtained time-domain signal according to the adjusted time envelope, so as to obtain a recovered transient signal.

An embodiment of the present invention further provides a transient signal processing system, where the system includes: a transient signal encoding device, configured to obtain a reference sub-frame where a maximal time envelope having a maximal amplitude value is located from time envelopes of all sub-frames of an input transient signal, adjust an amplitude value of the time envelope of each sub-frame before the reference sub-frame in such a way that a first difference is greater than a preset first threshold, and write the adjusted time envelope into bitstream, in which the first difference is a difference between the amplitude value of the time envelope of each sub-frame before the reference sub-frame and the amplitude value of the maximal time envelope; and a transient signal decoding device, configured to modify a pre-obtained time-domain signal according to the time envelope in the received bitstream, so as to obtain a recovered transient signal.

An embodiment of the present invention further provides another transient signal processing system, where the system includes: a transient signal encoding device, configured to write a time envelope of each sub-frame of a transient signal in a bitstream; and a transient signal decoding device, configured to obtain a reference sub-frame where a maximal time envelope having a maximal amplitude value is located from time envelopes of all sub-frames of a signal in the received bitstream, adjust an amplitude value of the time envelope of each sub-frame before the reference sub-frame in such a way that a first difference is greater than a preset first threshold, and modify a pre-obtained time-domain signal according to the adjusted time envelope to obtain a recovered transient signal, in which the first difference is a difference between the amplitude value of the time envelope of each sub-frame before the reference sub-frame and the amplitude value of the maximal time envelope.

According to the transient signal encoding method and device, decoding method and device, and processing system of the present invention, the time envelope is modified according to characteristics of the transient signal, such that the difference between the amplitude value of the time envelope having the maximal amplitude value and the amplitude values of the time envelopes of the other sub-frames before the sub-frame corresponding to the time envelope having the maximal amplitude value is more distinct, thereby improving the effect of recovery of the transient signal.

BRIEF DESCRIPTION OF THE DRAWINGS

To make the technical solutions under the present invention clearer, the accompanying drawings for illustrating the embodiments of the present invention or the prior art are outlined in the following. Apparently, the accompanying drawings are for the exemplary purpose only, and persons of ordinary skill in the art can derive other drawings from such accompanying drawings without any creative effort.

DETAILED DESCRIPTION OF THE EMBODIMENTS

The technical solutions of the present invention are further described in detail with reference to the accompanying drawings and embodiments in the following. The technical solutions according to the embodiments of the present invention will be clearly and completely described in the following with reference to the accompanying drawings. It is distinct that the embodiments to be described are only a part rather than all of the embodiments of the present invention. All other embodiments obtained by persons of ordinary skill in the art based on the embodiments of the present invention without creative efforts shall fall within the protection scope of the present invention.

Figure 1:
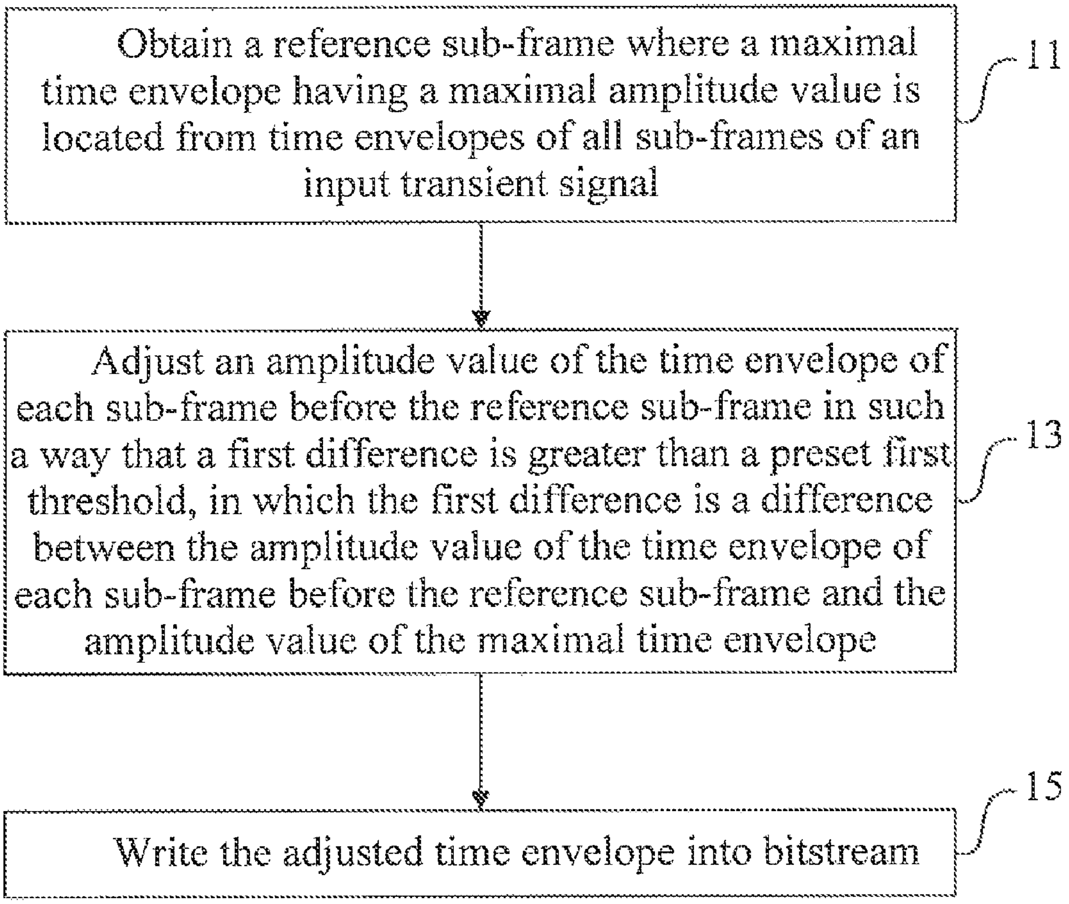
FIG. 1 is a flow chart of a transient signal encoding method according to a first embodiment of the present invention.

FIG. 1 is a flow chart of a transient signal encoding method according to a first embodiment of the present invention. As shown in FIG. 1, the method includes the following steps.

In Step 11, a sub-frame where a time envelope having a maximal amplitude value (that is, a maximal time envelope) is located is obtained from time envelopes of all sub-frames of an input transient signal, in which the sub-frame is the reference sub-frame described in the embodiments of the present invention.

When the number of bits for encoding an input signal is insufficient, a small number of bits are generally adopted to encode important information of high-frequency band. During the process of encoding the high-frequency band information, when the number of available bits is constant, in order to better recover the high-frequency band information, the input signals may be classified, for example, the input signals may be classified into transient signals and non-transient signal, so as to adopt different encoding technologies for different types of signals. This embodiment mainly relates to processing of the transient signals.

A method for obtaining a time envelope according to the embodiment of the present invention includes: dividing an input signal into one or more sub-frames; obtaining energy information of each sub-frame, for example, the energy of each sub-frame and the square root of energy information of each sub-frame, to obtain the energy information; and schematically expressing waveform characteristics or amplitude trends of the input time-domain signal by using the obtained energy information.

After the time envelope of the transient signal is obtained, the time envelope may be modified according to the characteristics of the transient signal, such that in the modified time envelope, the difference between the amplitude values of time envelopes of the sub-frames included in the transient signal is more distinct, which is specifically represented in that the difference between the amplitude value of the time envelope having the maximal amplitude value and the amplitude values of other time envelopes is more distinct, so as to highlight the characteristics of the transient signal.

In Step 13, an amplitude value of the time envelope of each sub-frame before the reference sub-frame is adjusted in such a way that a first difference is greater than a preset first threshold, in which the first difference is a difference between the amplitude value of the time envelope of each sub-frame before the reference sub-frame and the amplitude value of the maximal time envelope.

The first threshold may be determined by the following method: decreasing the amplitude value of the time envelope of each sub-frame before the reference sub-frame to ⅛ to ½ of the original amplitude value, obtaining a difference between the adjusted amplitude values of the time envelopes of the sub-frames and the amplitude value of the time envelope of the reference sub-frame, and using the difference as the first threshold.

In Step 15, the adjusted time envelope is written into bitstream.

Based on the technical solution, the adjustment of the time envelope may further include: calculating an average amplitude value of the time envelopes of each sub-frame after the reference sub-frame; and adjusting the amplitude value of the time envelope of each sub-frame after the reference sub-frame in such a way that a second difference is greater than a preset second threshold when the average amplitude value is lower than or equal to a preset reference value, in which the second difference is a difference between the amplitude value of the time envelope of each sub-frame after the reference sub-frame and the amplitude value of the maximal time envelope.

The preset reference value may be selected to be ⅓ to ⅗ of the amplitude value of the time envelope of the reference sub-frame; and the second threshold may be determined by the following method: decreasing the amplitude value of the time envelope of each sub-frame after the reference sub-frame to ⅛ to ½ of the original amplitude value, obtaining a difference between the adjusted amplitude values of the time envelopes of the sub-frames and the amplitude value of the time envelope of the reference sub-frame, and using the difference as the second threshold.

After the amplitude value of the time envelope of each sub-frame other than the reference sub-frame is adjusted, the adjustment of the time-domain signal in the technical solution may further include: adjusting the amplitude value of the time envelope of the reference sub-frame in such a way that an average energy of the adjusted time envelope of each sub-frame of the transient signal is greater than a preset third threshold.

The third threshold may be selected from the range satisfying the following condition: the average energy of the adjusted time envelope of each sub-frame of the transient signal is equivalent to the average energy of the adjusted time envelope of each sub-frame, for example, the former is 0.8 to 1.2 times the latter.

In order to improve the quality of the transient signal recovered at the decoding end, the time envelope corresponding to the transient signal needs to be encoded more finely. In this embodiment, during the process of finely encoding the time envelope corresponding to the transient signal, the time envelope of the transient signal can be modified according to the characteristics of the transient signal distinguished from the non-transient signal, such that the difference between the amplitude values of the time envelopes of the sub-frames included by the transient signal is more distinct, thereby improving the quality of the transient signal recovered at the decoding end.

In this embodiment, the time envelope of the transient signal is modified according to the characteristics of the transient signal, the difference between the amplitude values of the time envelopes of the sub-frames of the transient signal is enlarged, and the modified time envelope information is sent to the decoding end; and therefore, the position information of the transient signal is encoded and the encoded position information is sent to the decoding end without consuming any number of bits, that is, the technical effect of improving the quality of the transient signal recovered at the decoding end can be realized without increasing the number of bits required by the encoding end.

Figure 2:
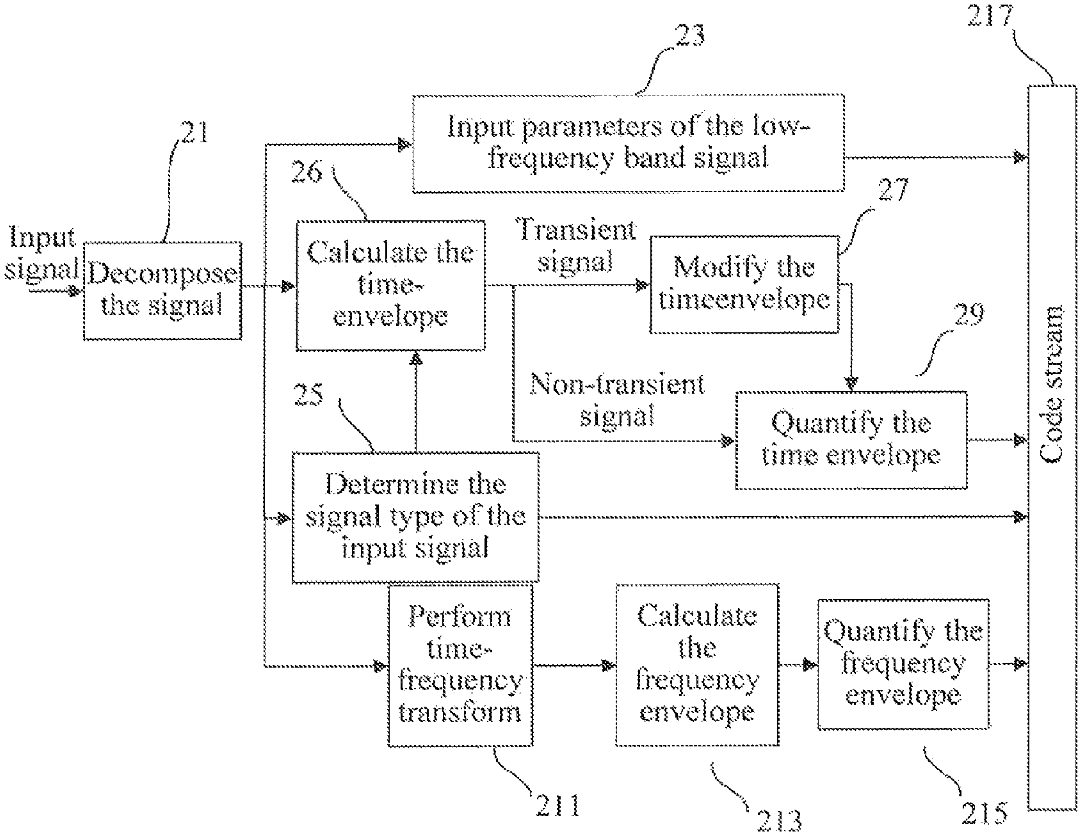
FIG. 2 is a flow chart of a transient signal encoding method according to a second embodiment of the present invention.

FIG. 2 is a flow chart of a transient signal encoding method according to a second embodiment of the present invention. As shown in FIG. 2, the method includes the following steps.

In Step 21, an input signal is decomposed into a low-frequency band signal and a high-frequency band signal; and as for the low-frequency band signal, Step 23 is performed, and as for the high-frequency band signal, Step 25 is performed.

In Step 23, parameters of the low-frequency band signal in the input signal are input into a bitstream; and Step 217 is performed.

In this embodiment, the parameters of the low-frequency band signal (broadband signal) are input into the bitstream through an encoder.

In Step 25, a signal type of the input signal (the high-frequency signal) is determined, and signal type information is input into the bitstream, in which the signal type information is configured to indicate whether the input signal (that is, the signal being currently encoded) is a transient signal or a non-transient signal.

In order to more accurately determine the signal type of the input signal, Step 25 may include Steps 2501 to 2509 (not shown).

In Step 2501, a long frame is formed with a preset number of consecutive frames in the high-frequency band signal, and an average energy of the long frame is calculated.

In a mode for forming the long frame, three consecutive frames including the current frame and two frames before the current frame are combined to form a long frame; or, three consecutive frames including the current frame, a frame before the current frame, and a frame after the current frame are combined to form a long frame; or, several other consecutive frames are combined to form a long frame. The average energy of the long frame may be calculated according to Formula (1):

$$\text{gain}=\tfrac{1}{2}\log 10(\text{ener}/N) \quad (1),$$

where, $$ener=\sum_{i=0}^{N} x[i]*x[i].$$

In Formula (1), gain is the average energy of the long frame; x[i] is a signal value of an $i^{th}$ sampling point of the time-domain signal; and N is the total number of sampling points of the whole long frame.

In Step 2503, the long frame is divided into several sub-frames, and an average energy of each sub-frame is calculated.

In this embodiment, it is assumed that each frame has a frame length of 5 ms, then the frame length of a long frame is 15 ms; the frame length of a long frame includes 480 sampling points, and if a long frame is divided into 12 sub-frames, the frame length of each sub-frame is 40 sampling points. An average energy sub_gain[i] of each sub-frame is calculated.

In Step 2505, a third difference and a fourth difference are calculated respectively, in which the third difference is a maximal difference between the average energy of each sub-frame and the average energy of the long frame, and the third difference is calculated according to Formula (2); and the fourth difference is a maximal difference between average energies of two consecutive sub-frames, and the fourth difference is calculated according to Formula (3).

$$max\_deviation=max(sub\_gain[i],gain) \quad (2)$$

In Formula (2), sub_gain[i] represents the average energy of each sub-frame, gain represents the average energy of the long frame, and max_deviation represents a maximal difference between the average energy of each sub-frame and the average energy of the long frame, that is, the third difference in the embodiments of the present invention.

$$max\_rise=max(sub\_gain[i],sub\_gain[i+1]) \quad (3)$$

In Formula (3), sub_gain[i] and sub_gain[i+1] represent the average energies of two consecutive sub-frames respectively, and max_rise represents a maximal difference between the average energies of two consecutive sub-frames in a long frame, that is, the fourth difference in the embodiments of the present invention.

In Step 2507, the average energy of the long frame is compared with a fourth threshold, the third difference is compared with a fifth threshold, and the fourth difference is compared with a sixth threshold, and if the average energy of the long frame is greater than the fourth threshold, the third difference is greater than the fifth threshold, and the fourth difference is greater than the sixth threshold (that is, Formula (4) is satisfied), it is determined that the high-frequency band signal is a transient signal; otherwise, it is determined that the high-frequency band signal is a non-transient signal.

$$gain>\alpha 1, max\_deviation>\alpha 2, max\_rise>\alpha 3 \quad (4)$$

In Formula (4), $\alpha 1$ represents the fourth threshold, $\alpha 2$ represents the fifth threshold; and $\alpha 3$ represents the sixth threshold. The values of $\alpha 1$, $\alpha 2$, and $\alpha 3$ are correlated to the amplitude of the input transient signal, and when the overall amplitude of the transient signal is large, the values of $\alpha 1$, $\alpha 2$, and $\alpha 3$ are large; and when the overall amplitude of the transient signal is small, the values of $\alpha 1$, $\alpha 2$, and $\alpha 3$ are small. For example, when the reference power level of the time envelope of the transient signal is −26 dB, the values of $\alpha 1$, $\alpha 2$, and $\alpha 3$ are in the ranges of $5<\alpha 1<10$, $2<\alpha 2<5$, $1<\alpha 3<3$.

In Step 2509, the obtained category information is input into a bitstream, and the category information includes transient signal information and non-transient signal information; and Step 217 is performed. As for a transient signal, Step 27 is performed; and as for a non-transient signal, the time envelope and the frequency-domain envelope of the non-transient signal can be obtained by using a method in the prior art, which will not be repeated herein.

It should be noted that, the method for classifying the input signal may be used in combination with the modification of the time envelope according to the present invention; moreover, when the time envelope of each sub-frame of the transient signal is not modified, the method for classifying the input signal may be used in combination with the method for encoding the transient signal in the prior art, and at this time, the accuracy of the identification of the transient signal can also be improved, thereby improving the effect of recovery of the transient signal at the decoding end.

In Step 26, the time envelope of each sub-frame of the input signal is calculated respectively, and if the signal type of the input signal is a transient signal, Step 27 is performed; and if the signal type of the input signal is a non-transient signal, Step 29 is performed.

In Step 27, the time envelope of the transient signal is modified.

Figure 3:
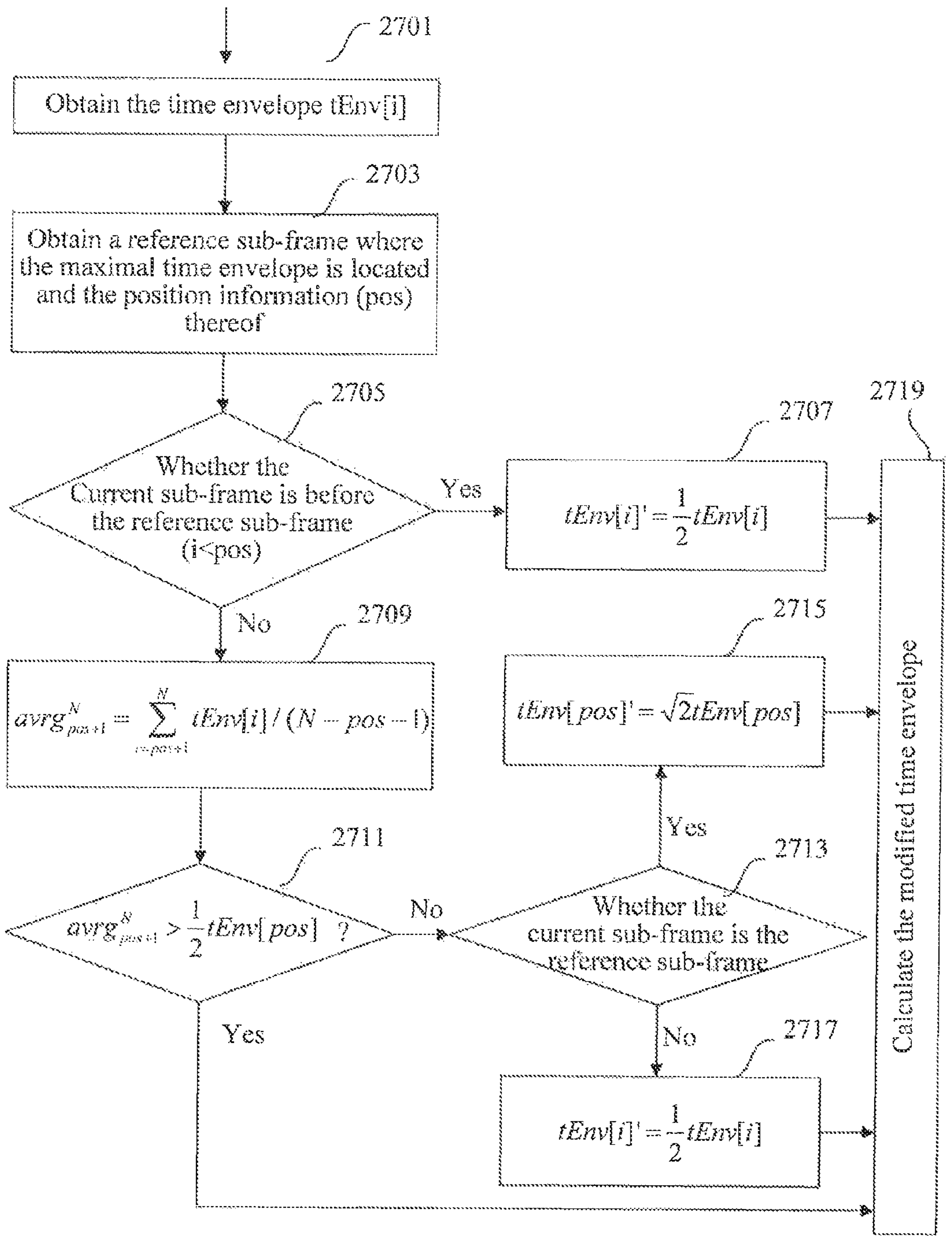
FIG. 3 is a block diagram of an embodiment of an encoding end modifying a time envelope of a transient signal according to the second embodiment of the present invention.

In order to highlight the characteristics of the transient signal, the time envelope of the transient signal is modified, for example, modification of increasing the amplitude value is performed on the time envelope having the maximal amplitude value, and/or, modification of decreasing the amplitude value is performed on other time envelopes. Specifically, Step 27 may include Step 2701 to Step 2719. FIG. 3 is a block diagram of an embodiment of an encoding end modifying a time envelope of a transient signal according to the second embodiment of the present invention. As shown in FIG. 3, the modification performed on the time envelope of the transient signal includes Step 2701 to Step 2719.

In Step 2701, the time envelope of each sub-frame of the transient signal is calculated, so as to obtain the time envelope tEnv[i] of each sub-frame.

In Step 2703, by searching in the time envelopes of the sub-frames obtained in Step 2701, a sub-frame where the maximal time envelope is located and position information corresponding to the sub-frame are obtained, in which the sub-frame is the reference sub-frame in the embodiments of the present invention, and for the convenience of illustration, the position information of the reference sub-frame is represented as pos in the following.

In Step 2705, the position information (i) of the current sub-frame is compared with the position information (pos) of the reference sub-frame, and if the current sub-frame is before the reference sub-frame (that is, i<pos), Step 2707 is performed; otherwise, Step 2709 is performed.

In Step 2707, modification of decreasing the amplitude value is performed on the time envelope of the current sub-frame, so as to obtain a first modified envelope, and Step 2719 is performed. The proportion by which the amplitude value is decreased may be determined according to the difference between the amplitude values of the time envelopes corresponding to the sub-frames and the amplitude value of the time envelope corresponding to the reference sub-frame, and if the difference is large, a small proportion by which the amplitude value is decreased may be selected; otherwise, a large proportion by which the amplitude value is decreased may be selected. FIG. 3 shows modification of dividing the value of the time envelope of the current sub-frame by 2, such that the modified time envelope (that is, the first modified envelope in the embodiments of the present invention) of the current sub-frame is decreased to be ½ of the time envelope before modification, that is:

$$tEnv[i]'=\tfrac{1}{2}tEnv[i],$$

where, tEnv[i]' represents the modified time envelope of the current sub-frame, and tEnv[i] represents the time envelope of the current sub-frame before modification.

In Step 2709, an average value $avrg_{pos+1}^{N}$ of the time envelope of each sub-frame after the reference sub-frame is calculated:

$$avrg_{post+1}^{N} = \sum_{i=post+1}^{N} tEnv[i] / (N - pos - 1).$$

In Step 2711, the average value $avrg_{pos+1}^{N}$ of the time envelope of each sub-frame after the reference sub-frame is compared with a preset reference value, in which the preset reference value in this embodiment is ½ of the time envelope corresponding to the reference sub-frame, that is, ½tEnv[pos], and if $\mathrm{avrg}_{pos+1}^{N} \leqq$ ½tEnv[pos], Step 2713 is performed; otherwise, the time envelope of the current sub-frame is not modified, and Step 2719 is performed. If the difference between the average value of the time envelope of each sub-frame after the reference sub-frame and the preset reference value is large, it indicates that the reference sub-frame corresponding to the maximal time envelope of the original signal is abruptly changed with respect to the sub-frame thereafter; and in order to enable the recovered signal to meet the original characteristics, the sub-frames may be modified. If the difference between the average value of the time envelope of each sub-frame after the reference sub-frame and the preset reference value is small, it indicates that the reference sub-frame corresponding to the maximal time envelope of the original signal is not abruptly changed with respect to the sub-frame thereafter, and at this time, the sub-frames may not be modified. Preferably, the preset reference value is ⅓ to ⅗ of the maximal time envelope of the transient signal.

In Step 2713, the position information of the current sub-frame is compared with the position information of the reference sub-frame, so as to determine whether the current sub-frame is the reference sub-frame, and if yes, Step 2715 is performed; otherwise, Step 2717 is performed.

In Step 2715, modification of increasing the amplitude value is performed on the time envelope corresponding to the reference sub-frame, so as to obtain a second modified envelope; and Step 2719 is performed.

FIG. 3 shows modification of multiplying the value of the time envelope of the current sub-frame by $\sqrt{2}$, such that the modified time envelope (that is, the second modified envelope in the embodiments of the present invention) of the reference sub-frame is increased to be $\sqrt{2}$ times the time envelope before modification, that is:

$$t\mathrm{Env}[\mathrm{pos}]' = \sqrt{2}\, t\mathrm{Env}[\mathrm{pos}],$$

where, tEnv[pos]' represents the modified time envelope of the reference sub-frame, and tEnv[pos] represents the time envelope of the reference sub-frame before modification.

In Step 2717, modification of decreasing the amplitude value is performed on the time envelope of the current sub-frame, so as to obtain a third modified envelope, and Step 2719 is performed. The proportion by which the amplitude value is decreased may be determined according to the difference between the amplitude values of the time envelopes corresponding to the sub-frames and the amplitude value of the time envelope corresponding to the reference sub-frame, and if the difference is large, a small proportion by which the amplitude value is decreased may be selected; otherwise, a large proportion by which the amplitude value is decreased may be selected.

FIG. 3 shows modification of dividing the value of the time envelope of the current sub-frame by 2, such that the modified time envelope (that is, the third modified envelope in the embodiments of the present invention) of the current sub-frame is decreased to be ½ of the time envelope before modification, that is:

$$t\mathrm{Env}[i]' = \tfrac{1}{2}\, t\mathrm{Env}[i],$$

where, tEnv[i]' represents the modified time envelope of the current sub-frame, and tEnv[i] represents the time envelope of the current sub-frame before modification.

In Step 2719, the first modified envelope obtained in Step 2707, the second modified envelope obtained in Step 2715, and the third modified envelope obtained in Step 2717 are combined, to obtain the modified time envelope of the transient signal.

Through Step 2701 to Step 2719, the modification of the time envelope of the transient signal is completed, and the modified time envelope of the transient signal is obtained.

In Step 211, time-frequency transform is performed on the high-frequency band signal in the input signal, so as to obtain a frequency-domain signal of the high-frequency band signal.

When the frequency-domain envelope of the transient signal is obtained, the time-domain signal corresponding to the transient signal is transformed to the frequency domain through a transform method such as fast Fourier transform (FFT) and modified discrete cosine transform (MDCT), so as to obtain the frequency-domain signal corresponding to the transient signal in the frequency domain.

No limitation is imposed on the time sequence of Step 211 and Step 25.

In Step 213, the frequency-domain envelope of each sub-band of the frequency-domain signal is calculated, so as to obtain the frequency-domain envelope of the high-frequency band signal.

The frequency-domain envelope in the embodiments of the present invention refers to: dividing the frequency-domain signal into one or more sub-bands, obtaining energy information of each sub-band or obtaining the square root of the energy information of each sub-band, and schematically expressing spectral waveform characteristics or amplitude trends of the frequency-domain signal by using the obtained energy information or the obtained square root of the energy information. Therefore, the frequency-domain signal is divided into one or more sub-bands, and the energy information of each sub-band or the square root of the energy information of each sub-band is obtained, and the frequency-domain envelope of each sub-band of the frequency-domain signal is obtained by using the obtained energy information or the obtained square root of the energy information.

In Step 215, the obtained frequency-domain envelope of the high-frequency band signal is quantified, and then is added in the bitstream; and Step 217 is performed.

In Step 217, the bitstream added with the parameters of the low-frequency band signal, the signal type information of the high-frequency band signal, the frequency-domain envelope and the modified time envelope are sent to the decoding end, in which the signal type information is configured to indicate whether the signal being currently encoded is a transient signal or a non-transient signal, such that the decoding end can determine the type of the decoded current signal according to the signal type information.

In this embodiment, when the signal type of the current high-frequency band signal is determined, identification of the transient signal is performed by combining information of several consecutive frames in the high-frequency band signal, and therefore, the accuracy of the identification of the transient signal is improved, and the transient signal can be separated from the input high-frequency band signal more accurately; moreover, in this embodiment, the time envelope corresponding to the separated transient signal is modified, such that the difference between the amplitude values of the time envelopes of the sub-frame of the transient signal is more distinct, thereby improving the quality of the transient signal recovered at the decoding end.

Figure 4:
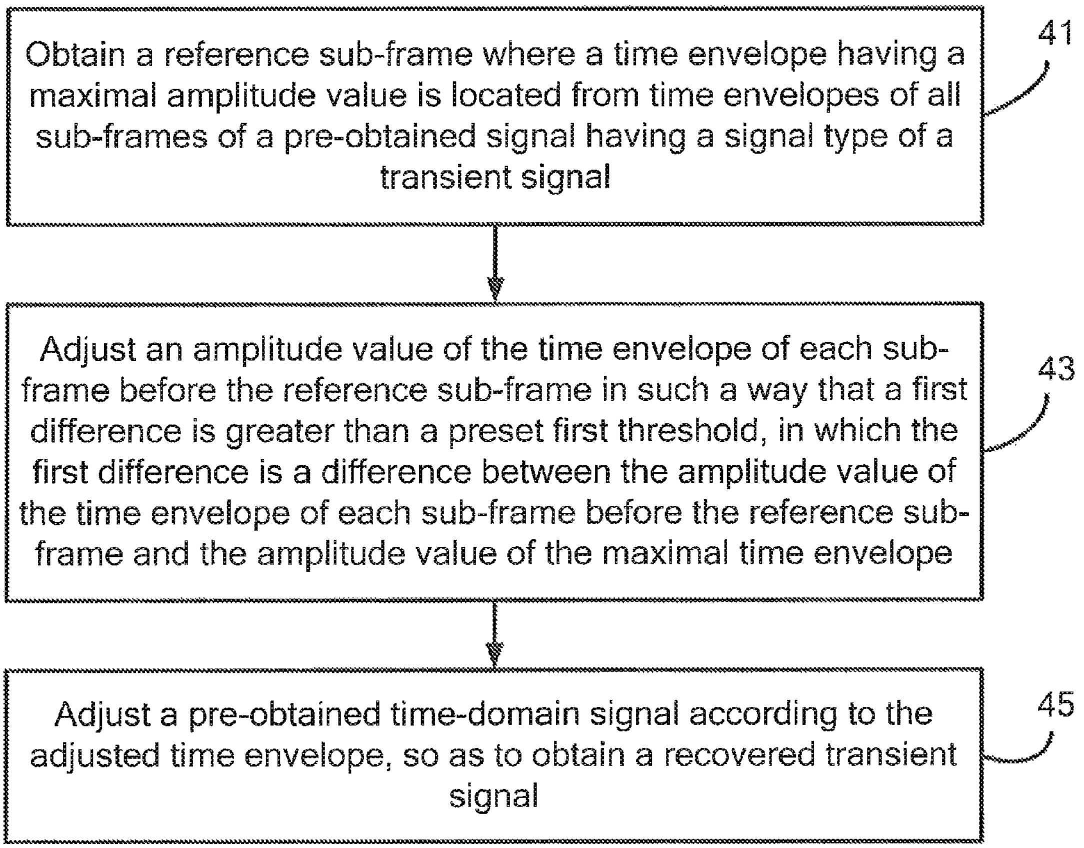
FIG. 4 is a flow chart of a transient signal decoding method according to a third embodiment of the present invention.

FIG. 4 is a flow chart of a transient signal decoding method according to a third embodiment of the present invention. As shown in FIG. 4, the method includes the following steps.

In Step 41, a sub-frame where a time envelope having a maximal amplitude value (that is, a maximal time envelope)

is located is obtained from time envelopes of all sub-frames of a pre-obtained signal having a signal type of a transient signal, in which the sub-frame is the reference sub-frame described in the embodiments of the present invention.

The modification of the time envelope of the transient signal may be performed at the encoding end or the decoding end. In this embodiment, the time envelope is modified according to the characteristics of the transient signal at the decoding end, such that in the modified time envelope, the difference between the amplitude value of the time envelope having the maximal amplitude value of the sub-frames of the transient signal and the amplitude values of other time envelopes is more distinct, so as to highlight the characteristics of the transient signal.

In Step 43, an amplitude value of the time envelope of each sub-frame before the reference sub-frame is adjusted in such a way that a first difference is greater than a preset first threshold, in which the first difference is a difference between the amplitude value of the time envelope of each sub-frame before the reference sub-frame and the amplitude value of the maximal time envelope.

The first threshold may be determined by the following method: decreasing the amplitude value of the time envelope of each sub-frame before the reference sub-frame to ⅛ to ½ of the original amplitude value, obtaining a difference between the adjusted amplitude values of the time envelopes of the sub-frames and the amplitude value of the time envelope of the reference sub-frame, and using the difference as the first threshold.

Based on the technical solution, the adjustment of the time envelope may further include: calculating an average amplitude value of the time envelopes of each sub-frame after the reference sub-frame; and adjusting the amplitude value of the time envelope of each sub-frame after the reference sub-frame in such a way that a second difference is greater than a preset second threshold when the average amplitude value is lower than or equal to a preset reference value, in which the second difference is a difference between the amplitude value of the time envelope of each sub-frame after the reference sub-frame and the amplitude value of the maximal time envelope.

The preset reference value may be selected to be ⅓ to ⅗ of the amplitude value of the time envelope of the reference sub-frame; and the second threshold may be determined by the following method: decreasing the amplitude value of the time envelope of each sub-frame after the reference sub-frame to ⅛ to ½ of the original amplitude value, obtaining a difference between the adjusted amplitude values of the time envelopes of the sub-frames and the amplitude value of the time envelope of the reference sub-frame, and using the difference as the second threshold.

After the amplitude value of the time envelope of each sub-frame other than the reference sub-frame is adjusted, the adjustment of the time-domain signal in the technical solution may further include: adjusting the amplitude value of the time envelope of the reference sub-frame in such a way that an average energy of the adjusted time envelope of each sub-frame of the transient signal is greater than a preset third threshold.

The third threshold may be selected from the range satisfying the following condition: the average energy of the adjusted time envelope of each sub-frame of the transient signal is equivalent to the average energy of the adjusted time envelope of each sub-frame, for example, the former is 0.8 to 1.2 times the latter.

In Step 45, a pre-obtained time-domain signal is modified according to the adjusted time envelope, so as to obtain a recovered transient signal.

The bitstream from the encoding end is decoded, to obtain the frequency-domain envelope of each sub-band of the signal having a signal type of a transient signal. A frequency-domain excitation signal is obtained from normalized low-frequency-band frequency-domain signals or random noises, a frequency-domain signal is generated according to the frequency-domain excitation signal and the frequency-domain envelope, and frequency-time transform is performed on the frequency-domain signal to obtain the time-domain signal. Then, the time-domain signal is modified according to the modified time envelope, such that the transient signal is recovered at the decoding end.

In this embodiment, the time envelope of the transient signal is modified at the decoding end, such that in the modified time envelope, the difference between the amplitude value of the time envelope having the maximal amplitude value and the amplitude values of other time envelopes is more distinct, so as to highlight the characteristics of the transient signal, thereby improving the quality of the transient signal recovered at the decoding end.

Figure 5:
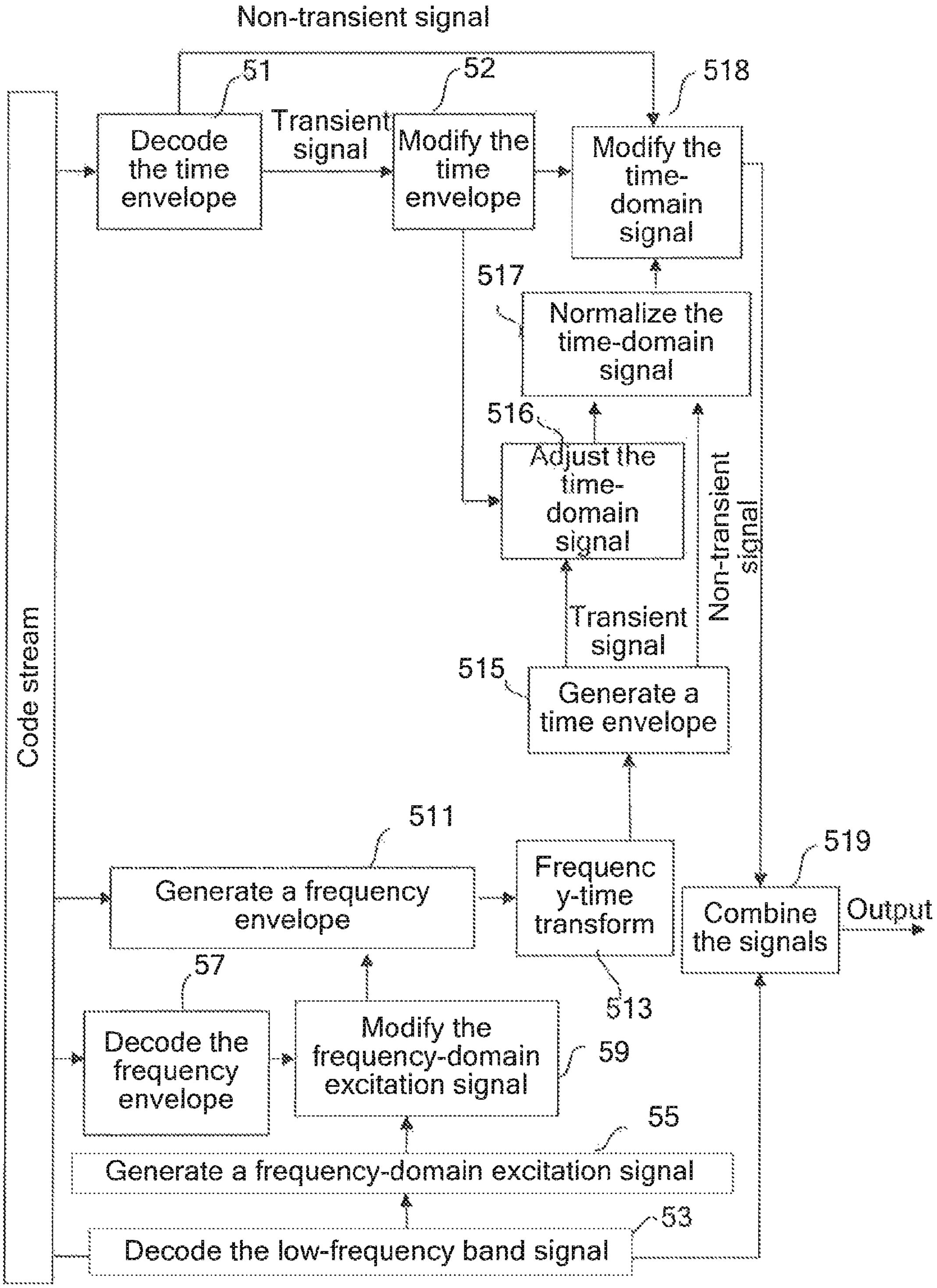
FIG. 5 is a flow chart of a transient signal decoding method according to a fourth embodiment of the present invention.

FIG. 5 is a flow chart of a transient signal decoding method according to a fourth embodiment of the present invention. As shown in FIG. 5, the method includes the following steps.

In Step 51, a bitstream from an encoding end is decoded, to obtain a time envelope and signal type information of a high-frequency band signal, and if the signal type is a transient signal, Step 52 is performed; and if the signal type is a non-transient signal, Step 518 is performed.

In Step 52, when the obtained signal type information indicates that the signal type is a transient signal, the time envelope is modified, so as to obtain a modified time envelope; and Step 518 is performed.

Figure 6:
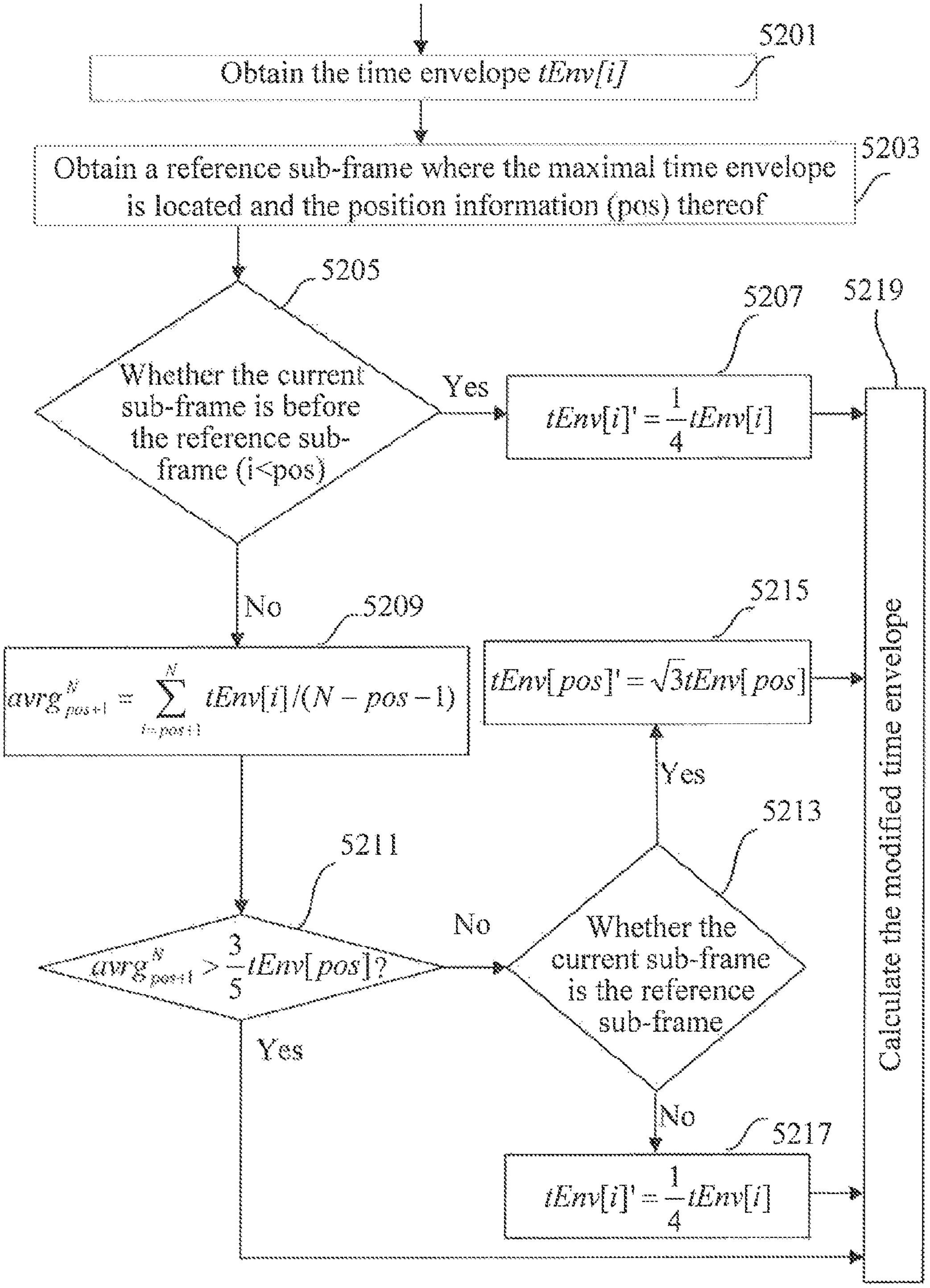
FIG. 6 is a block diagram of an embodiment of a decoding end modifying a time envelope of a transient signal according to the fourth embodiment of the present invention.

In order to highlight the characteristics of the transient signal, when the current signal type is a transient signal, the time envelope is modified: modification of increasing the amplitude value is performed on the time envelope having the maximal amplitude value, and/or, modification of decreasing the amplitude value is performed on other time envelopes. Step 52 may include Step 5201-Step 5219. FIG. 6 is a block diagram of an embodiment of a decoding end modifying a time envelope of a transient signal according to the fourth embodiment of the present invention. As shown in FIG. 6, when the current signal type is a transient signal, the modification performed on the time envelope by the decoding end includes Step 5201 to Step 5219.

In Step 5201, the bitstream from the encoding end is decoded, to obtain a time envelope of each sub-frame of the high-frequency band signal and signal type information. If the signal type information indicates that the type of the current signal in the bitstream is a transient signal, Step 5203 is performed, to modify the time envelope; and if the signal type information indicates that the type of the current signal in the bitstream is a non-transient signal, the signal is decoded by using a decoding method in the prior art to recover the non-transient signal, which will not be repeated herein.

In Step 5203, by searching in the time envelopes of the sub-frames obtained in Step 5201, a sub-frame where the maximal time envelope is located and position information corresponding to the sub-frame are obtained, in which the sub-frame is the reference sub-frame in the embodiments of the present invention, and for the convenience of illustration, the position information of the reference sub-frame is represented as pos in the following.

In Step 5205, the position information (i) of the current sub-frame is compared with the position information (pos) of the reference sub-frame, and if the current sub-frame is before the reference sub-frame (that is, i<pos), Step 5207 is performed; otherwise, Step 5209 is performed.

In Step 5207, modification of decreasing the amplitude value is performed on the time envelope of the current sub-frame, so as to obtain a first modified envelope, and Step 5219 is performed.

For example, modification of dividing the value of the time envelope of the current sub-frame by 4 is adopted, such that the modified time envelope (that is, the first modified envelope in the embodiments of the present invention) of the current sub-frame is decreased to be ¼ of the time envelope before modification, that is:

$$tEnv[i]' = \frac{1}{4} tEnv[i],$$

where, tEnv[i]' represents the modified time envelope of the current sub-frame, and tEnv[i] represents the time envelope of the current sub-frame before modification.

In Step 5209, an average value $avrg_{pos+1}{}^{N}$ of the time envelope of each sub-frame after the reference sub-frame is calculated:

$$avrg_{post+1}^{N} = \sum_{i=post+1}^{N} tEnv[i] / (N - pos - 1).$$

In Step 5211, the average value $avrg_{pos+1}{}^{N}$ of the time envelope of each sub-frame after the reference sub-frame is compared with a preset reference value, in which the preset reference value in this embodiment is ¼ of the time envelope corresponding to the reference sub-frame, that is, ¼tEnv[pos], and if $avrg_{pos+1}{}^{N} \leqq \frac{3}{5} tEnv[pos]$, Step 5213 is performed; otherwise, the time envelope of the current sub-frame is not modified, and Step 5219 is performed.

In Step 5213, the position information of the current sub-frame is compared with the position information of the reference sub-frame, so as to determine whether the current sub-frame is the reference sub-frame, and if yes, Step 5215 is performed; otherwise, Step 5217 is performed.

In Step 5215, modification of increasing the amplitude value is performed on the time envelope corresponding to the reference sub-frame, so as to obtain a second modified envelope; and Step 5219 is performed.

For example, modification of multiplying the value of the time envelope of the current sub-frame by $\sqrt{3}$ is performed, such that the modified time envelope (that is, the second modified envelope in the embodiments of the present invention) of the reference sub-frame is increased to be $\sqrt{3}$ times the time envelope before modification, that is:

$$tEnv[pos]' = \sqrt{3} tEnv[pos],$$

where, tEnv[pos]' represents the modified time envelope of the reference sub-frame, and tEnv[pos] represents the time envelope of the reference sub-frame before modification.

In Step 5217, modification of decreasing the amplitude value is performed on the time envelope of the current sub-frame, so as to obtain a third modified envelope, and Step 5219 is performed.

For example, modification of dividing the value of the time envelope of the current sub-frame by 4 is adopted, such that the modified time envelope (that is, the third modified envelope in the embodiments of the present invention) of the current sub-frame is decreased to be ¼ of the time envelope before modification, that is:

$$tEnv[i]' = \frac{1}{4} tEnv[i],$$

where, tEnv[i]' represents the modified time envelope of the current sub-frame, and tEnv[i] represents the time envelope of the current sub-frame before modification.

In Step 5219, the first modified envelope obtained in Step 5207, the second modified envelope obtained in Step 5215, the third modified envelope obtained in Step 5217, and the time envelope that does not meet the modification conditions in Step 5211 and is not subjected to time-domain modification are combined, to obtain the modified time envelope of the transient signal.

Through Step 5201 to Step 5219, the modification of the time envelope of the transient signal is completed, and the modified time envelope of the transient signal is obtained.

In Step 53 of FIG. 5, the bitstream from the encoding end is decoded, to obtain the low-frequency band signal; and Step 519 is performed.

In this embodiment, the low-frequency band signal in the bitstream is decoded by a decoder.

No limitation is imposed on the time sequence of Step 51 and Step 53.

In Step 55, a frequency-domain excitation signal of the high-frequency band signal is generated.

The frequency-domain excitation signal of the high-frequency band signal is obtained from normalized low-frequency-band frequency-domain signals or random noises.

In Step 57, the bitstream from the encoding end is decoded, to obtain the frequency-domain envelope of each sub-band of the high-frequency band signal.

No limitation is imposed on the time sequence of Step 55 and Step 57.

In Step 59, the frequency-domain excitation signal is modified by using the frequency-domain envelope of each sub-band of the high-frequency band signal.

The objective of the modification is to enable the energy of the recovered frequency spectrum to be equivalent to the energy of the real high-frequency band spectrum.

In Step 511, a high-frequency-band frequency-domain signal is generated according to the modified frequency-domain excitation signal; and the high-frequency-band frequency-domain signal may be calculated according to Formula (5):

$$spectrum[i] = exc[i] * fEnv[j] \quad (5).$$

In Formula (5), exc[i] represents the frequency-domain excitation signal; fEnv[j] represents the frequency-domain envelope; and spectrum[i] represents the high-frequency-band frequency-domain signal.

In Step 513, frequency-time transform is performed on the generated high-frequency-band frequency-domain signal.

In Step 515, the time-domain signal is generated. If the type of the high-frequency band signal is a transient signal, Step 516 is performed, and if the high-frequency band signal is a non-transient signal, Step 517 is performed.

In Step 516, the time-domain signal having a signal type of a transient signal is adjusted, to obtain the adjusted time-domain signal signal'[i].

A preset number of sampling points in the reference sub-frame are selected; and signal amplitude of each of the selected sampling points is adjusted in such a way that a fifth difference is greater than a seventh threshold, in which the fifth difference is a difference between the signal amplitude value of each of the selected sampling points and a maximal amplitude value of the reference sub-frame.

The seventh threshold may be selected from the following range: decreasing the amplitudes of the selected sampling points to be ½ of the original amplitudes, and obtaining the differences between the adjusted amplitudes of the sampling points and the maximal amplitude among the amplitudes of the sampling points included in the reference sub-frame.

A preset number of sampling points included in the sub-frame where the time envelope having the maximal amplitude value is located are selected, and the signal amplitudes of the sampling points are decreased, so as to adjust the time-domain signal. The specific method for adjustment of the time-domain signal and the preset number of sampling points required to be adjusted are mainly dependent upon the characteristics of the original input signal.

For example, during the adjustment of the time-domain signal, a preset number of sampling points included in the sub-frame where the time envelope having the maximal amplitude value is located are selected sequentially, for example, the sampling points in the first ¼ sub-frame length included in the time-domain signal corresponding to the reference sub-frame where the time envelope having the maximal amplitude value is located are selected, and the amplitude values of the selected sampling points are divided by 2. If a number of bits can be used for transmitting flag information at the encoding end and the decoding end, these bit positions can be used to carry the flag information to the decoding end, for example, when the encoding end has a bit for transmitting the flag information, the decoding end can determine whether to adjust the preset number of sampling points according to the flag bit; when the encoding end has multiple bit positions for carrying the flag information, the decoding end can determine which sampling points need to be adjusted according to the received flag bits; and when the encoding end has sufficient bit positions for carrying the flag information, the decoding end can determine whether each sampling point needs to be adjusted according to the received flag information.

It should be noted that, the method for adjusting the time-domain signal may be used in combination with the modification of the time envelope according to the present invention; moreover, when the time envelope of each sub-frame of the transient signal is not modified, the method for adjusting the time-domain signal may be used in combination with the method for encoding the transient signal in the prior art, and at this time, the characteristics of the transient signal can also be highlighted, thereby improving the effect of recovery of the transient signal.

In Step 517, the obtained time-domain signal signal'[i] is normalized.

In Step 518, by using the modified time envelope obtained in Step 52, the normalized time-domain signal having a signal type of a transient signal is modified, so as to obtain a recovered transient signal; and by using the time envelope signal having a signal type of non-transient signal obtained in Step 51, the corresponding time-domain signal is modified, so as to obtain a recovered non-transient signal.

The normalized time-domain signal having a signal type of a transient signal may be modified according to Formula (6):

$$signal[i]=signal'[i]*tEnv[j]/tEnv[j]' \quad (6).$$

In Formula (6), signal'[i] represents the modified time-domain signal; tEnv[j] represents the modified time envelope; tEnv[j]' represents the time envelope of the modified time-domain signal (signal'[i]); and signal[i] represents the time-domain signal of the high-frequency band signal.

In Step 519, the recovered low-frequency band signal and high-frequency band signal are combined, to obtain the output wide-frequency band signal, in which the recovered high-frequency band signal includes the recovered transient signal and the recovered non-transient signal.

In this embodiment, no limitation is imposed on the time sequence of Step 51, Step 57, and Step 53.

In this embodiment, the time envelope corresponding to the transient signal in the high-frequency band signal obtained through decoding at the decoding end is modified, such that the difference between the amplitude values of the time envelopes of all sub-frames corresponding to the transient signal is more distinct, thereby improving the quality of the transient signal recovered at the decoding end; moreover, in this embodiment, before the time-domain signal is modified by using the time envelope, the amplitudes of the sampling points before the time-domain signal of the sub-frame having the maximal time envelope are decreased, so as to highlight the characteristics of the transient signal, thereby significantly improving the output effect of the transient signal in the output signal.

Figure 7:
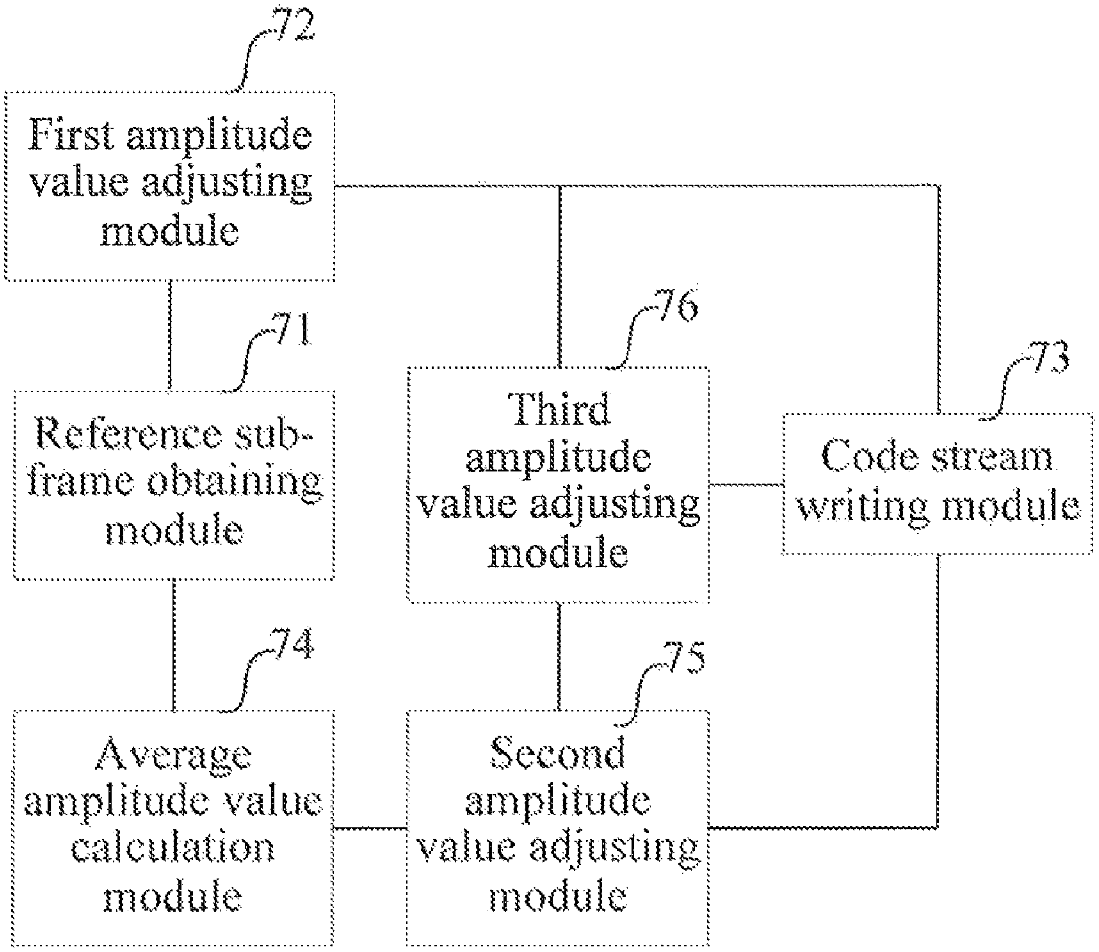
FIG. 7 is a schematic structural view of a transient signal encoding device according to a fifth embodiment of the present invention.

FIG. 7 is a schematic structural view of a transient signal encoding device according to a fifth embodiment of the present invention. As shown in FIG. 7, the transient signal encoding device of this embodiment includes: a reference sub-frame obtaining module 71, a first amplitude value adjusting module 72, and a bitstream writing module 73.

The reference sub-frame obtaining module 71 is configured to obtain a reference sub-frame where a time envelope having a maximal amplitude value (that is, a maximal time envelope) is located from time envelopes of all sub-frames of an input transient signal.

The first amplitude value adjusting module 72 is configured to adjust an amplitude value of the time envelope of each sub-frame before the reference sub-frame in such a way that a first difference is greater than a preset first threshold, in which the first difference is a difference between the amplitude value of the time envelope of each sub-frame before the reference sub-frame and the amplitude value of the maximal time envelope. The first threshold may be determined by the following method: decreasing the amplitude value of the time envelope of each sub-frame before the reference sub-frame to ⅛ to ½ of the original amplitude value, obtaining a difference between the adjusted amplitude values of the time envelopes of the sub-frames and the amplitude value of the time envelope of the reference sub-frame, and using the difference as the first threshold.

The bitstream writing module 73 is configured to write the adjusted time envelope into bitstream.

Based on the technical solution, the transient signal encoding device of this embodiment further includes: an average amplitude value calculation module 74, a second amplitude value adjusting module 75, and a third amplitude value adjusting module 76.

The average amplitude value calculation module 74 is configured to calculate an average amplitude value of the time envelopes of each sub-frame after the reference sub-frame.

The second amplitude value adjusting module 75 is configured to adjust the amplitude value of the time envelope of each sub-frame after the reference sub-frame in such a way that a second difference is greater than a preset second threshold when the average amplitude value is lower than or equal to a preset reference value, in which the second difference is a difference between the amplitude value of the time envelope of each sub-frame after the reference sub-frame and the amplitude value of the maximal time envelope. The preset reference value may be selected to be ⅓ to ⅗ of the amplitude value of the time envelope of the reference sub-frame; and the second threshold may be determined by the following method: decreasing the amplitude value of the time envelope of each sub-frame after the reference sub-frame to ⅛ to ½ of the original amplitude value, obtaining a difference between the adjusted amplitude values of the time envelopes of the sub-frames and the amplitude value of the time envelope of the reference sub-frame, and using the difference as the second threshold.

The third amplitude value adjusting module 76 is configured to adjust an amplitude value of the time envelope of the reference sub-frame in such a way that an average energy of the adjusted time envelope of each sub-frame of the transient signal is greater than a preset third threshold, after the amplitude value of the time envelope of each sub-frame other than the reference sub-frame is adjusted. The third threshold may be selected from the range satisfying the following condition: the average energy of the adjusted time envelope of each sub-frame of the transient signal is equivalent to the average energy of the adjusted time envelope of each sub-frame, for example, the former is 0.8 to 1.2 times the latter.

In this embodiment, during the process of finely encoding the time envelope corresponding to the transient signal, the first amplitude value adjusting module can modify the time envelope of the transient signal according to the characteristics of the transient signal, such that the difference between the amplitude values of the time envelopes of the sub-frames included by the transient signal is more distinct, thereby improving the quality of the transient signal recovered at the decoding end.

Figure 8:
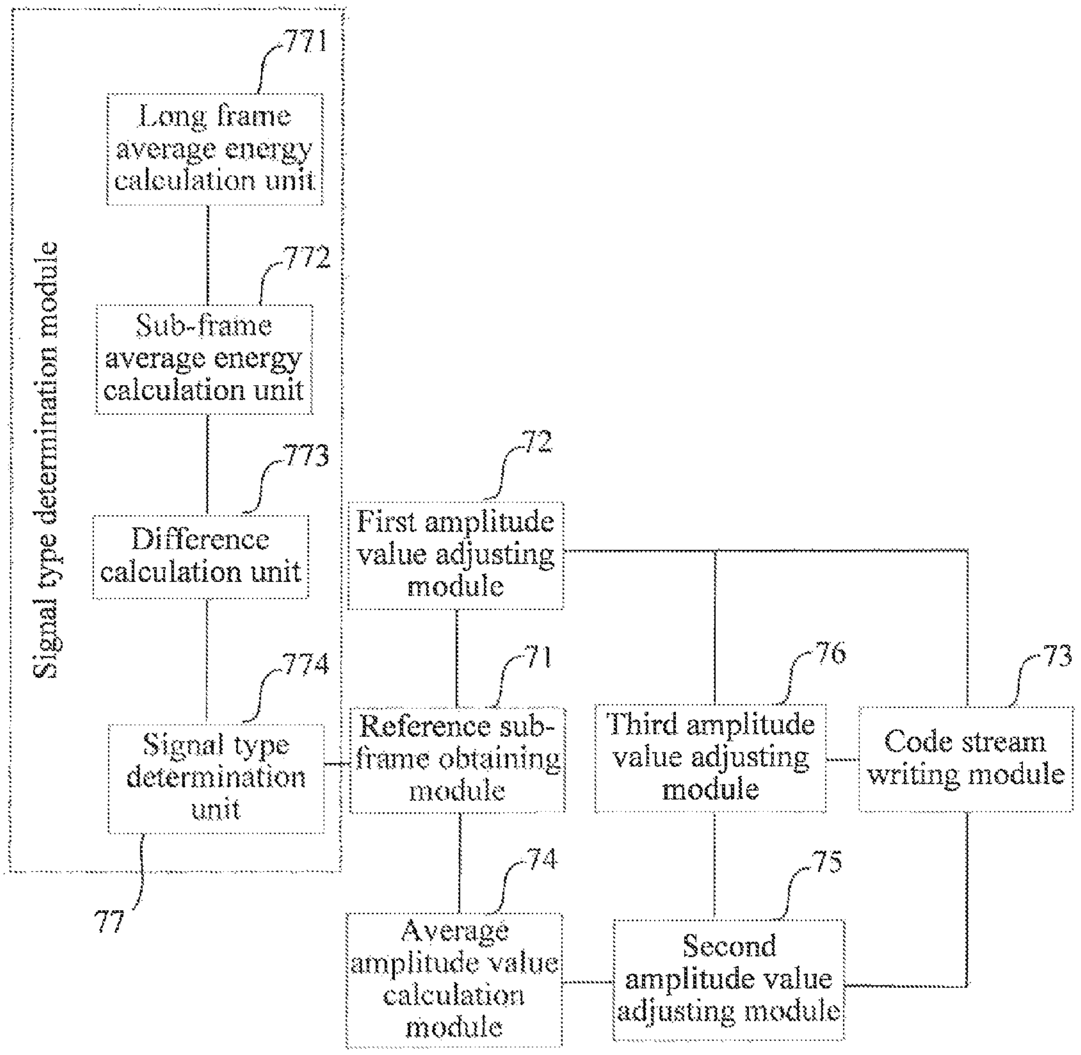
FIG. 8 is a schematic structural view of a transient signal encoding device according to a sixth embodiment of the present invention.

FIG. 8 is a schematic structural view of a transient signal encoding device according to a sixth embodiment of the present invention. Different from the embodiment in FIG. 7, the transient signal encoding device of this embodiment further includes a signal type determination module 77.

The signal type determination module 77 is configured to determine a signal type of the input signal, and write signal type information in the encoding bitstream, in which the signal type includes a transient signal or a non-transient signal.

The signal type determination module 77 may include a long frame average energy calculation unit 771, a sub-frame average energy calculation unit 772, a difference calculation unit 773, and a signal type determination unit 774.

The long frame average energy calculation unit 771 is configured to form a long frame with a preset number of consecutive frames in the input signal and calculate an average energy of the long frame.

The sub-frame average energy calculation unit 772 is configured to divide the long frame into multiple sub-frames and calculate an average energy of each sub-frame.

The difference calculation unit 773 is configured to calculate a third difference and a fourth difference respectively, in which the third difference is a maximal difference between the average energy of each sub-frame and the average energy of the long frame, and the fourth difference is a maximal difference between average energies of two consecutive sub-frames.

The signal type determination unit 774 is configured to determine that the input signal is a transient signal when the average energy of the long frame is greater than a fourth threshold, the third difference is greater than a fifth threshold, and the fourth difference is greater than a sixth threshold; otherwise, determine that the input signal is a non-transient signal.

In this embodiment, when the signal type of the current high-frequency band signal is determined, identification of the transient signal is performed by combining information of several consecutive frames in the high-frequency band signal, and therefore, the accuracy of the identification of the transient signal is improved, and the transient signal can be separated from the input high-frequency band signal more accurately; moreover, in this embodiment, the time envelope corresponding to the separated transient signal is modified, such that the difference between the amplitude values of the time envelopes of the sub-frame of the transient signal is more distinct, thereby improving the quality of the transient signal recovered at the decoding end.

Figure 9:
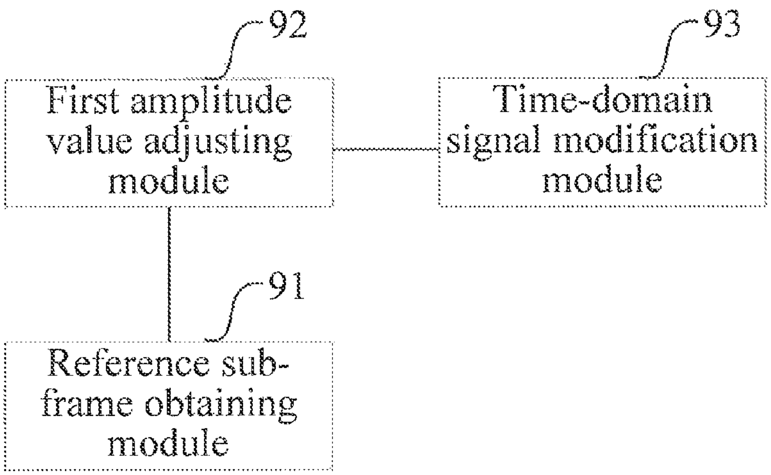
FIG. 9 is a schematic structural view of a transient signal decoding device according to a seventh embodiment of the present invention.

FIG. 9 is a schematic structural view of a transient signal decoding device according to a seventh embodiment of the present invention. As shown in FIG. 9, the transient signal encoding device of this embodiment includes: a reference sub-frame obtaining module 91, a first amplitude value adjusting module 92, and a time-domain signal modification module 93.

The reference sub-frame obtaining module 91 is configured to obtain a reference sub-frame where a time envelope having a maximal amplitude value (that is, a maximal time envelope) is located from time envelopes of all sub-frames of a pre-obtained signal having a signal type of a transient signal.

The first amplitude value adjusting module 92 is configured to adjust an amplitude value of the time envelope of each sub-frame before the reference sub-frame in such a way that a first difference is greater than a preset first threshold, in which the first difference is a difference between the amplitude value of the time envelope of each sub-frame before the reference sub-frame and the amplitude value of the maximal time envelope.

The time-domain signal modification module 93 is configured to modify a pre-obtained time-domain signal according to the adjusted time envelope, so as to obtain a recovered transient signal.

In this embodiment, the time envelope of the transient signal is modified by the time envelope modification module at the decoding end, such that in the modified time envelope, the difference between the amplitude value of the time envelope having the maximal amplitude value and the amplitude values of other time envelopes is more distinct, so as to highlight the characteristics of the transient signal, thereby improving the quality of the transient signal recovered at the decoding end.

Figure 10:
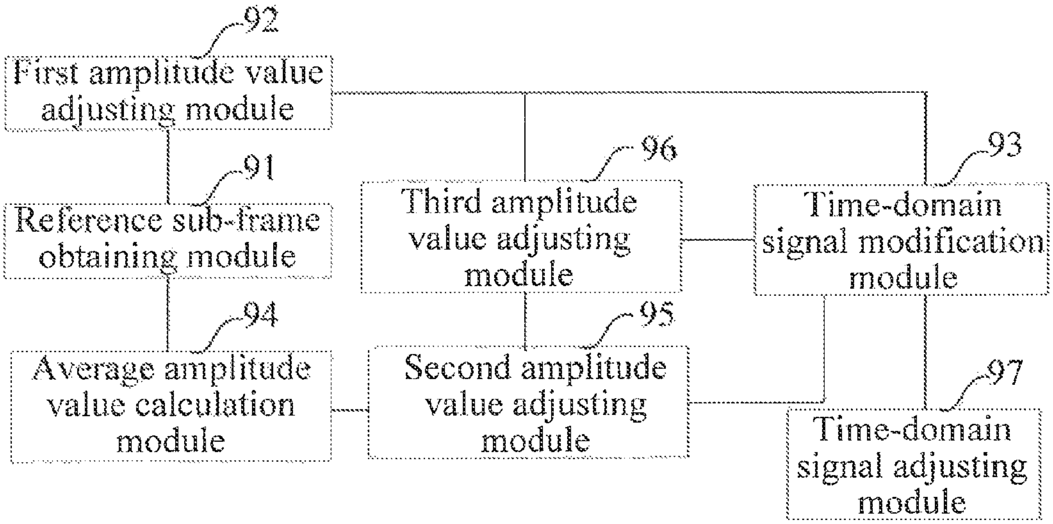
FIG. 10 is a schematic structural view of a transient signal decoding device according to an eighth embodiment of the present invention.

FIG. 10 is a schematic structural view of a transient signal decoding device according to an eighth embodiment of the present invention. Different from the embodiment in FIG. 9, the transient signal decoding device of this embodiment further includes: an average amplitude value calculation module 94, a second amplitude value adjusting module 95, and a third amplitude value adjusting module 96.

The average amplitude value calculation module 94 is configured to calculate an average amplitude value of the time envelopes of each sub-frame after the reference sub-frame.

The second amplitude value adjusting module 95 is configured to adjust the amplitude value of the time envelope of each sub-frame after the reference sub-frame in such a way that a second difference is greater than a preset second threshold when the average amplitude value is lower than or equal to a preset reference value, in which the second difference is a difference between the amplitude value of the time envelope of each sub-frame after the reference sub-frame and the amplitude value of the maximal time envelope.

The third amplitude value adjusting module 96 is configured to adjust an amplitude value of the time envelope of the reference sub-frame in such a way that an average energy of the adjusted time envelope of each sub-frame of the transient signal is greater than a preset third threshold, after the amplitude value of the time envelope of each sub-frame other than the reference sub-frame is adjusted.

Based on the technical solution, the transient signal decoding device of this embodiment may further include a time-domain signal adjusting module 97.

The time-domain signal adjusting module 97 is configured to select a preset number of sampling points in the reference sub-frame, and adjust signal amplitude of each of the selected sampling points in such a way that a fifth difference is greater than a seventh threshold, in which the fifth difference is a difference between the signal amplitude value of each of the selected sampling points and a maximal amplitude value of the reference sub-frame.

In this embodiment, the time envelope corresponding to the transient signal in the high-frequency band signal obtained through decoding at the decoding end is modified, such that the difference between the amplitude values of the time envelopes of all sub-frames corresponding to the transient signal is more distinct, thereby improving the quality of the transient signal recovered at the decoding end; moreover, in this embodiment, before the time-domain signal is modified by using the time envelope, the amplitudes of the sampling points before the time-domain signal of the sub-frame having the maximal time envelope are decreased, so as to highlight the characteristics of the transient signal, thereby significantly improving the output effect of the transient signal in the output signal.

Figure 11:
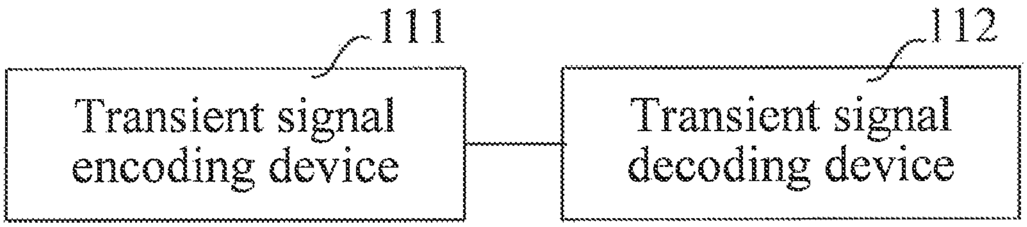
FIG. 11 is a schematic structural view of a transient signal processing system according to a ninth embodiment of the present invention.

FIG. 11 is a schematic structural view of a transient signal processing system according to a ninth embodiment of the present invention. As shown in FIG. 11, the transient signal processing system of the present invention includes a transient signal encoding device 111 and a transient signal decoding device 112.

The modification of the time envelope of the transient signal may be performed at the encoding end.

The transient signal encoding device 111 is configured to obtain a reference sub-frame where a time envelope having a maximal amplitude value (that is, a maximal time envelope) is located from time envelopes of all sub-frames of an input transient signal, adjust an amplitude value of the time envelope of each sub-frame before the reference sub-frame in such a way that a first difference is greater than a preset first threshold, and write the adjusted time envelope into bitstream, in which the first difference is a difference between the amplitude value of the time envelope of each sub-frame before the reference sub-frame and the amplitude value of the maximal time envelope.

The transient signal decoding device 112 is configured to modify a pre-obtained time-domain signal according to the time envelope in the received bitstream, so as to obtain a recovered transient signal.

In this embodiment, the time envelope of the transient signal is modified at the encoding end, and the difference between the amplitude value of the time envelope having the maximal amplitude value among the time envelopes of all sub-frames of the transient signal and the amplitude values of other time envelopes is enlarged, so as to highlight the characteristics of the transient signal, thereby improving the quality of the transient signal recovered at the decoding end.

In the transient signal processing system of this embodiment, as for the specific detailed structure of the transient signal encoding device 111, reference can be made to the description of the embodiments in FIGS. 7 and 8, and as for the specific principle of the modification of the time envelope of the transient signal, reference can be made to the description of the embodiments in FIGS. 1 to 3, which will not be repeated herein.

Alternatively, the modification of the time envelope of the transient signal may be performed at the decoding end.

The transient signal encoding device 111 is configured to write a time envelope of each sub-frame of a transient signal in a bitstream.

The transient signal decoding device 112 is configured to obtain a reference sub-frame where a maximal time envelope having a maximal amplitude value is located from time envelopes of all sub-frames of a signal in the received bitstream, adjust an amplitude value of the time envelope of each sub-frame before the reference sub-frame in such a way that a first difference is greater than a preset first threshold, and modify a pre-obtained time-domain signal according to the adjusted time envelope to obtain a recovered transient signal, in which the first difference is a difference between the amplitude value of the time envelope of each sub-frame before the reference sub-frame and the amplitude value of the maximal time envelope.

In this embodiment, the time envelope of the transient signal is modified at the decoding end, and the difference between the amplitude value of the time envelope having the maximal amplitude value among the time envelopes of all sub-frames of the transient signal and the amplitude values of other time envelopes is enlarged, so as to highlight the characteristics of the transient signal, thereby improving the quality of the transient signal recovered at the decoding end.

In the transient signal processing system of this embodiment, as for the specific detailed structure of the transient signal decoding device 112, reference can be made to the description of the embodiments in FIGS. 9 and 10, and as for the specific principle of the modification of the time envelope of the transient signal, reference can be made to the description of the embodiments in FIGS. 4 to 6, which will not be repeated herein.

It should be understood by persons of ordinary skill in the art that the accompanying drawings are merely schematic views of preferred embodiments, and modules or processes in the accompanying drawings are not indispensable for implementing the present invention.

It should be understood by persons of ordinary skill in the art that, modules in a device according to an embodiment may be distributed in the device of the embodiment according to the description of the embodiment, or correspondingly disposed in one or more devices different from this embodiment. The modules of the above embodiment may be combined into one module, or further divided into multiple sub-modules.

The sequence numbers of the above embodiments of the present invention are merely for the convenience of description, and do not imply the preference among the embodiments.

Persons of ordinary skill in the art should understand that all or a part of the steps of the method according to the embodiments of the present invention may be implemented by a program instructing relevant hardware. The program may be stored in a computer readable storage medium. When the program is run, the steps of the method according to the embodiments of the present invention are performed. The storage medium may be any medium that is capable of storing program codes, such as a Read Only Memory (ROM), a Random Access Memory (RAM), a magnetic disk, and an optical disk.

Finally, it should be noted that the above embodiments are merely provided for describing the technical solutions of the present invention, but not intended to limit the present invention. It should be understood by persons of ordinary skill in the art that although the present invention has been described in detail with reference to the foregoing embodiments, modifications can be made to the technical solutions described in the foregoing embodiments, or equivalent replacements can be made to some technical features in the technical solutions, as long as such modifications or replacements do not cause the essence of corresponding technical solutions to depart from the spirit and scope of the present invention.

What is claimed is:

1. A transient signal encoding method, comprising:

obtaining a reference sub-frame where a maximal time envelope having a maximal amplitude value is located from time envelopes of all sub-frames of an input transient signal;

adjusting an amplitude value of the time envelope of each sub-frame before the reference sub-frame in such a way that a first difference is greater than a preset first threshold, wherein the first difference is a difference between the amplitude value of the time envelope of each sub-frame before the reference sub-frame and the amplitude value of the maximal time envelope; and writing the adjusted time envelope into a bitstream.

2. The transient signal encoding method according to claim 1, further comprising:

calculating an average amplitude value of the time envelopes of each sub-frame after the reference sub-frame; and adjusting the amplitude value of the time envelope of each sub-frame after the reference sub-frame in such a way that a second difference is greater than a preset second threshold when the average amplitude value is lower than or equal to a preset reference value, wherein the second difference is a difference between the amplitude value of the time envelope of each sub-frame after the reference sub-frame and the amplitude value of the maximal time envelope.

3. The transient signal encoding method according to claim 2, wherein after adjusting the amplitude value of the time envelope of each sub-frame other than the reference sub-frame, the method further comprises:

adjusting an amplitude value of the time envelope of the reference sub-frame in such a way that an average energy of the adjusted time envelope of each sub-frame of the, transient signal is greater than a preset third threshold.

4. The transient signal encoding method according to claim 1, further comprising:

determining a signal type of the input signal; and writing a signal type information into the encoding bitstream, wherein the signal type comprises a transient signal or a non-transient signal.

5. The transient signal encoding method according to claim 4, wherein the determining the signal type of the input signal comprises:

forming a long frame with a preset number of consecutive frames in the input signal, and calculating an average energy of the long frame;

dividing the long frame into multiple sub-frames, and calculating an average energy of each sub-frame;

calculating a third difference and a fourth difference respectively, wherein the third difference is a maximal difference between the average energy of each sub-frame and the average energy of the long frame, and wherein the fourth difference is a maximal difference between average energies of two consecutive sub-frames; and determining that the input signal is a transient signal when the average energy of the long frame is greater than a fourth threshold, the third difference is greater than a fifth threshold, and the fourth difference is greater than a sixth threshold; otherwise, determining that the input signal is a non-transient signal.

6. A transient signal decoding method, comprising:

obtaining a reference sub-frame where a maximal time envelope having a maximal amplitude value is located from time envelopes of all sub-frames of a pre-obtained signal having a signal type of a transient signal;

adjusting an amplitude value of the time envelope of each sub-frame before the reference sub-frame in such a way that a first difference is greater than a preset first threshold, wherein the first difference is a difference between the amplitude value of the time envelope of each sub-frame before the reference sub-frame and the amplitude value of the maximal time envelope; and modifying a pre-obtained time-domain signal according to the adjusted time envelope, so as to obtain a recovered transient signal.

7. The transient signal decoding method according to claim 6, further comprising:

calculating an average amplitude value of the time envelope of each sub-frame after the reference sub-frame; and adjusting the amplitude value of the time envelope of each sub-frame after the reference sub-frame in such a way that a second difference is greater than a preset second threshold when the average amplitude value is lower than or equal to a preset reference value, wherein the second difference is a difference between the amplitude value of the time envelope of each sub-frame after the reference sub-frame and the amplitude value of the maximal time envelope.

8. The transient signal decoding method according to claim 7, wherein after adjusting the amplitude value of the time envelope of each sub-frame other than the reference sub-frame, the method further comprises:

adjusting an amplitude value of the time envelope of the reference sub-frame in such a way that an average energy of the adjusted time envelope of each sub-frame of the transient signal is greater than a preset third threshold.

9. The transient signal decoding method according to claim 6, wherein before the modifying the pre-obtained time-domain signal according to the adjusted time envelope, the method further comprises:

selecting a preset number of sampling points in the reference sub-frame; and adjusting signal amplitude of each of the selected sampling points in such a way that a fifth difference is greater than a seventh threshold, wherein the fifth difference is a difference between the signal amplitude value of each of the selected sampling points and a maximal amplitude value of the reference sub-frame.

10. A transient signal encoding device, comprising:

a reference sub-frame obtaining module, configured to obtain a reference sub-frame where a maximal time envelope having a maximal amplitude value is located from time envelopes of all sub-frames of an input transient signal;

a first amplitude value adjusting module, configured to adjust an amplitude value of the time envelope of each sub-frame before the reference sub-frame in such a way that a first difference is greater than a preset first threshold, wherein the first difference is a difference between the amplitude value of the time envelope of each sub-frame before the reference sub-frame and the amplitude value of the maximal time envelope; and a bitstream writing module, configured to write the adjusted time envelope into a bitstream.

11. The transient signal encoding device according to claim 10, further comprising:

an average amplitude value calculation module, configured to calculate an average amplitude value of the time envelopes of each sub-frame after the reference sub-frame; and a second amplitude value adjusting module, configured to adjust the amplitude value of the time envelope of each sub-frame after the reference sub-frame in such a way that a second difference is greater than a preset second threshold when the average amplitude value is lower than or equal to a preset reference value, wherein the second difference is a difference between the amplitude value of the time envelope of each sub-frame after the reference sub-frame and the amplitude value of the maximal time envelope.

12. The transient signal encoding device according to claim 11, further comprising:

a third amplitude value adjusting module, configured to adjust an amplitude value of the time envelope of the reference sub-frame in such a way that an average energy of the adjusted time envelope of each sub-frame of the transient signal is greater than a preset third threshold, after the amplitude value of the time envelope of each sub-frame other than the reference sub-frame is adjusted.

13. The transient signal encoding device according to claim 12, further comprising:

a signal type determination module, configured to determine a signal type of the input signal, and write signal type information in the encoding bitstream, wherein the signal type comprises a transient signal or a non-transient signal.

14. The transient signal encoding device according to claim 13, wherein the signal type determination module comprises:

a long frame average energy calculation unit, configured to form a long frame with a preset number of consecutive frames in the input signal and calculate an average energy of the long frame;

a sub-frame average energy calculation unit, configured to divide the long frame into multiple sub-frames and calculate an average energy of each sub-frame;

a difference calculation unit, configured to calculate a third difference and a fourth difference respectively, wherein the third difference is a maximal difference between the average energy of each sub-frame and the average energy of the long frame, and the fourth difference is a maximal difference between average energies of two consecutive sub-frames; and a signal type determination unit, configured to determine that the input signal is a transient signal when the average energy of the long frame is greater than a fourth threshold, the third difference is greater than a fifth threshold, and the fourth difference is greater than a sixth threshold;

otherwise, determine that the input signal is a non-transient signal.

* * * * *

UNITED STATES PATENT AND TRADEMARK OFFICE

CERTIFICATE OF CORRECTION

PATENT NO. : 8,063,809 B2
APPLICATION NO. : 13/172652
DATED : November 22, 2011
INVENTOR(S) : Zexin Liu et al.

It is certified that error appears in the above-identified patent and that said Letters Patent is hereby corrected as shown below:

On the front page of the patent Item 30 the publication number in the Foreign Priority Data section should be 200810247009.7

Signed and Sealed this
Third Day of January, 2012

David J. Kappos
*Director of the United States Patent and Trademark Office*